(12) United States Patent
Oga

(10) Patent No.: US 8,039,932 B2
(45) Date of Patent: Oct. 18, 2011

(54) LEAD FRAME, SEMICONDUCTOR DEVICE, METHOD OF MANUFACTURING THE LEAD FRAME, AND METHOD OF MANUFACTURING THE SEMICONDUCTOR DEVICE

(75) Inventor: Akira Oga, Shiga (JP)

(73) Assignee: Panasonic Corporation, Osaka (JP)

( * ) Notice: Subject to any disclaimer, the term of this patent is extended or adjusted under 35 U.S.C. 154(b) by 302 days.

(21) Appl. No.: 12/189,952

(22) Filed: Aug. 12, 2008

(65) Prior Publication Data

US 2009/0045492 A1 Feb. 19, 2009

(30) Foreign Application Priority Data

Aug. 15, 2007 (JP) .................. 2007-211611

(51) Int. Cl.
*H01L 23/495* (2006.01)

(52) U.S. Cl. .. 257/666; 257/670; 257/676; 257/E23.031

(58) Field of Classification Search .................. 257/666, 257/670, 676, E23.031
See application file for complete search history.

(56) References Cited

U.S. PATENT DOCUMENTS

| | | | | |
|---|---|---|---|---|
| 5,633,205 A | 5/1997 | Tsuchiya et al. | ................. | 29/827 |
| 5,869,355 A | 2/1999 | Fukaya | .................... | 438/123 |
| 5,939,774 A | 8/1999 | Yamada | .................... | 257/666 |
| 5,955,778 A * | 9/1999 | Shingai | .................... | 257/666 |
| 6,396,139 B1 * | 5/2002 | Huang | .................... | 257/696 |

FOREIGN PATENT DOCUMENTS

| | | |
|---|---|---|
| JP | 1-133340 | 5/1989 |
| JP | 3-12448 | 2/1991 |
| JP | 6-291236 | 10/1994 |
| JP | 7-202104 | 8/1995 |
| JP | 11-67805 | 3/1999 |

OTHER PUBLICATIONS

Kouyama, S. et al, "VLSI Packaging for Logic Device," vol. 2, NIKKEI BP, Inc., 1993, pp. 165-170.

* cited by examiner

*Primary Examiner* — Andy Huynh

(74) *Attorney, Agent, or Firm* — Steptoe & Johnson LLP

(57) ABSTRACT

A lead frame is provided which can prevent a short circuit between wires and the ends of adjacent leads, the short circuit being caused by wire sweep during the injection of molding resin, in a configuration where the electrodes of a semiconductor chip and the leads disposed around the semiconductor chip. The lead having sides substantially perpendicular to the direction of a resin flow has an end whose upstream side relative to the resin flow is constricted.

20 Claims, 11 Drawing Sheets

US 8,039,932 B2

LEAD FRAME, SEMICONDUCTOR DEVICE, METHOD OF MANUFACTURING THE LEAD FRAME, AND METHOD OF MANUFACTURING THE SEMICONDUCTOR DEVICE

FIELD OF THE INVENTION

The present invention relates to a lead frame, a semiconductor device using the same, a method of manufacturing the lead frame, and a method of manufacturing the semiconductor device.

BACKGROUND OF THE INVENTION

In recent years, quad flat packages (hereinafter, will be referred to as QFPs) have been widely used as one form of semiconductor devices using lead frames. FIG. 13 is a sectional view of a typical QFP semiconductor device of the prior art.

As shown in FIG. 13, in the QFP semiconductor device, a semiconductor chip 6 having an IC formed thereon is fixed on the top surface of a die pad 14 with an adhesive 7. Further, a plurality of electrodes (not shown) formed on a surface of the semiconductor chip 6 are connected, via a plurality of wires 8, to a plurality of leads 2 radially disposed around the die pad 14. The semiconductor chip 6, the die pad 14, the wires 8, and the joints of the leads 2 and the wires 8 are integrally molded with a molding resin member 18. The leads 2 are bent into gull-wing shapes outside the molding resin member 18.

In response to multifunctional electronic equipment in smaller sizes and with higher densities, systematic semiconductor components such as a semiconductor device with higher densities and higher functionality have been demanded. In QFP semiconductor devices, the number of pins has been increased, the pitch of leads has been reduced, and heat dissipation has been improved (for example, see "Practical Lesson, VLSI Packaging Technology (II)", supervised by Susumu Kouyama and Kunihiko Naruse, Nikkei Business Publications, Inc., published on May 31, 1993, pp. 165-170).

Generally, a semiconductor device of high power consumption is configured such that a die pad acting as a radiator plate is exposed from a molding resin member or a radiator plate is separately provided or exposed from the molding resin member, in order to efficiently dissipate heat generated during operations (for example, see Japanese Patent Laid-Open No. 6-291236). FIG. 14 is a sectional view of a QFP semiconductor device including a radiator plate of the prior art.

As shown in FIG. 14, in the QFP semiconductor device, a semiconductor chip 6 having an IC formed thereon is fixed on the top surface of a radiator plate 5 with an adhesive 7. Further, a plurality of electrodes (not shown) formed on a surface of the semiconductor chip 6 are connected, via a plurality of wires 8, to a plurality of leads 2 radially disposed around the semiconductor chip 6 mounted on the radiator plate 5. The radiator plate 5 is bonded to the undersides of the ends of the leads 2 with insulating tape 3 having been die-cut into a predetermined frame shape. The semiconductor chip 6, the radiator plate 5, the wires 8, and the joints of the leads 2 and the wires 8 are integrally molded with a molding resin member 18. The leads 2 are bent into gull-wing shapes outside the molding resin member 18.

In this way, the number of pins has been increased and the pitch of leads has been reduced in QFP semiconductor devices. Thus also in lead frames, leads have been reduced in width and pitch, so that the leads are disadvantageously deformed.

In order to reduce deformations on leads, lead frames have been generally manufactured as follows: first, a metal plate is etched or stamped to form a pattern in which the ends of adjacent leads are connected to each other. Next, after a plating step and a taping step (a step of bonding insulating tape for fixing the leads), the ends of the leads are cut by stamping (for example, see Japanese Patent Laid-Open No. 1-133340).

FIGS. 15 to 18 are main part plan views and process sectional views for explaining the steps of manufacturing the QFP semiconductor device including the radiator plate of the prior art. FIGS. 19 to 21 are process sectional views for explaining the steps of manufacturing the QFP semiconductor device including the radiator plate of the prior art.

First, as shown in FIG. 15, a metal plate is worked by etching or stamping to integrally form a frame (not shown) and the plurality of leads 2 which are connected to the frame and protrude to the center of the frame. At this point, the ends of the adjacent leads 2 are worked to be connected to each other. Before or after this working step, plating is performed on the ends of the leads 2 (portions to be the ends after cutting), the overall metal plate, or a part to be formed into the lead frame on the metal plate.

Next, as shown in FIG. 16, the insulating tape 3 having been die-cut into a predetermined frame shape is bonded to the undersides of the ends of the leads 2 (portions to be the ends after cutting).

After that, as shown in FIG. 17, the connected ends of the leads 2 protruding inward out of the inner frame of the insulating tape 3 are cut by stamping using a cutting die 4, so that the leads 2 are separated from one another. At this point, the leads 2 are fixed with the insulating tape 3 and thus the leads 2 are not separately deformed.

Next, as shown in FIG. 18, the radiator plate 5 having been die-cut into a predetermined shape is bonded to the underside of the insulating tape 3 and is disposed in the frame.

After the steps of FIGS. 15 to 18, a lead frame 1 is completed.

After that, as shown in FIG. 19, the semiconductor chip 6 having a plurality of electrodes (not shown) formed thereon is fixed on the top surface of the radiator plate 5 with the adhesive 7.

Next, as shown in FIG. 20, the plurality of electrodes (not shown) formed on a surface of the semiconductor chip 6 are connected to the plurality of leads 2 via the wires 8.

After that, as shown in FIG. 21, the lead frame 1 is sandwiched by molding dies 9a and 9b, molding resin in a pot 10 is melted, the molten molding resin is injected into the dies with a plunger 11 through a runner 12 and a gate 13, and then the molding resin having been injected into the dies is cured to form the molding resin member.

The leads protruding from the molding resin member are partially cut and bent (not shown) thereafter to complete the QFP semiconductor device.

As has been discussed, in the prior art, a pattern is formed in which the ends of adjacent leads are connected to each other, the insulating tape having been die-cut into a predetermined frame shape is bonded to the undersides of the ends of the leads (portions to be the ends after cutting), and then the connected ends of the leads protruding inward out of the inner frame of the insulating tape are cut.

However, in a QFP semiconductor device in which the number of pins has been increased and the pitch of leads has been reduced, a short circuit caused by wire sweep has become apparent as will be described below:

In the manufacturing process of the lead frame used for the QFP semiconductor device including the radiator plate, insulating tape having been die-cut into a predetermined frame shape is bonded to the undersides of the ends of the leads, and then the ends of the leads are cut by stamping. In the cutting step, when the insulating tape and the leads having a different degree of hardness than that of the insulating tape are cut together, the leads cannot be sharply cut. Thus it is necessary to cut the ends of the leads inside the inner frame of the insulating tape. For this reason, considering the installation accuracy of the lead frame to the cutting die and the die-cutting accuracy and bonding accuracy of the insulating tape, the inner frame of the insulating tape and cut surfaces on the ends of the leads have to be separated from each other at least by about 0.1 mm to 0.4 mm.

Further, in the wire bonding step, the electrodes of the semiconductor chip and the ends of the leads are connected to each other via the wires. In order to securely connect the electrodes and the ends of the leads, it is necessary to securely bond the insulating tape immediately under bonding points. Thus the bonding points of the lead frame including the radiator plate have to be set farther as compared with the bonding points (generally separated from the end sides of leads by about 0.1 mm to 0.5 mm) of a lead frame including a die pad by about 0.1 mm to 0.4 mm.

As has been discussed, in the QFP semiconductor device including the radiator plate, the bonding points on the leads are disposed away from the end sides of the leads. In the resin molding step, the wires are deformed from the upstream side to the downstream side of a resin flow by a pressure of molding resin flowing from the resin injection gate 13 (generally from one of four package corners in a QFP), so that the wires are circularly deformed in plan view as shown in FIG. 22. Thus when the bonding points on the leads are disposed away from the end sides of the leads, as shown in FIG. 23, the wires come close to the ends of the leads adjacent to the wires on the downstream side of a resin flow. When the wires are considerably deformed, a short circuit may occur. This problem is evident particularly in a semiconductor device using a lead frame having multiple pins and leads with a small pitch.

DISCLOSURE OF THE INVENTION

The present invention has been devised in view of the problem. An object of the present invention is to provide a lead frame, a semiconductor device using the lead frame, and a method of manufacturing the lead frame whereby a short circuit of a wire to an adjacent lead can be suppressed, the short circuit being caused by wire sweep in a resin molding step, in the semiconductor device using the lead frame having multiple pins and leads with a small pitch.

In order to attain the object, a lead frame of the present invention includes at least: a frame; a support plate disposed in the frame; and a plurality of leads which are connected to the frame and protrude to the center of the frame, wherein of the leads, at least the lead having sides substantially perpendicular to the direction of a resin flow has an end whose upstream side relative to the resin flow is constricted.

Further, the constricted side of the lead forms an angle of 75° to 105° relative to the injection direction of resin.

Moreover, the support plate is a die pad, and the lead frame further includes at least one die pad support which is connected to the frame and supports the die pad.

Further, the support plate is a radiator plate, and the lead frame further includes frame insulating tape disposed between the top surface of the radiator plate and the undersides of the ends of the leads.

Moreover, the leads protrude inward out of the inner frame of the insulating tape.

Further, the end of the lead having the constricted side has a width smaller than the thickness of the end of the lead.

Moreover, another lead is adjacent to the constricted side of the lead.

A semiconductor device of the present invention includes at least: a semiconductor chip having a plurality of electrodes; a support plate on which the semiconductor chip is mounted; a plurality of leads which are disposed around the semiconductor chip mounted on the support plate and protrude to the semiconductor chip mounted on the support plate; a plurality of wires for connecting the electrodes of the semiconductor chip mounted on the support plate and the leads; and a molding resin member for integrally molding, with resin, the semiconductor chip, the support plate, the wires, and the joints of the leads and the wires, wherein of the leads, at least the lead having sides substantially perpendicular to the direction of a resin flow includes an end whose upstream side relative to the resin flow is constricted, and of the wires, the wire connected to the lead having the constricted side is connected to the lead over a constricted portion.

Further, the constricted side of the lead forms an angle of 75° to 105° relative to the injection direction of resin.

Moreover, the support plate is a die pad, and the semiconductor device further includes at least one die pad support for supporting the die pad.

Further, the support plate is a radiator plate, and the semiconductor device further includes frame insulating tape disposed between the top surface of the radiator plate and the undersides of the ends of the leads.

Moreover, the leads protrude inward out of the inner frame of the insulating tape.

Further, the end of the lead having the constricted side has a width smaller than the thickness of the end of the lead.

Moreover, another lead is adjacent to the constricted side of the lead.

A method of manufacturing a lead frame according to the present invention includes: a first step of working a metal plate to integrally form at least a frame and a plurality of leads which are connected to the frame and protrude to the center of the frame, the adjacent leads having ends connected to each other; a second step of bonding frame insulating tape to the undersides of the ends of the leads; a third step of separating the leads by cutting the ends of the leads protruding inward out of the inner frame of the insulating tape; and a fourth step of bonding a radiator plate to the underside of the insulating tape, wherein in the first step, at least the lead having sides substantially perpendicular to the direction of a resin flow has a portion to be the end of the lead after cutting, and the upstream side of the portion relative to the resin flow is constricted.

Further, in the first step, the constricted side of the lead forms an angle of 75° to 105° relative to the injection direction of resin.

According to the preferred embodiments of the present invention, it is possible to achieve a reliable semiconductor device which can suppress a short circuit of a wire to an adjacent lead, the short circuit being caused by wire sweep during the injection of molding resin.

In the prior art, molding resin having low viscosity is used for resin molding to reduce resin-flow resistance. Thus it is not possible to reduce a resin injection time and a curing time in the prior art.

Further, in recent years, lead frames with multiple rows have been used to improve productivity. However, when using lead frames having multiple rows, molten resin injected out of a pot passes through a runner and flows into the cavities (dies for respective packages) of the rows, causing variations in time periods from when injection is started to when the cavities are filled with the resin. For this reason, when using a lead frame having multiple rows in the prior art, the resin molding conditions are further restricted.

On the other hand, the preferred embodiments of the present invention can structurally suppress a short circuit caused by wire sweep. Thus it is possible to relax the conditions in a resin molding step, reduce a resin injection time and a curing time with molding resin having a short curing time, and increase the number of rows in the lead frame. Consequently, the preferred embodiments of the present invention can improve the productivity of the semiconductor device. The lead frame, the semiconductor device, and the method of manufacturing the lead frame according to the present invention are useful for the stable production of the semiconductor device.

As has been discussed, the lead frame, the semiconductor device, and the method of manufacturing the lead frame according to the present invention can prevent a short circuit between a wire and the end of an adjacent lead caused by wire sweep during the injection of molding resin, and thus the present invention is useful for the production of a QFP package and so on using a lead frame.

DESCRIPTION OF THE EMBODIMENTS

First Embodiment

Figure 5:
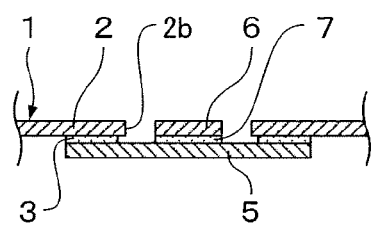
FIG. 5 is a process sectional view for explaining the manufacturing process of the semiconductor device according to the first embodiment of the present invention.
Figure 6:
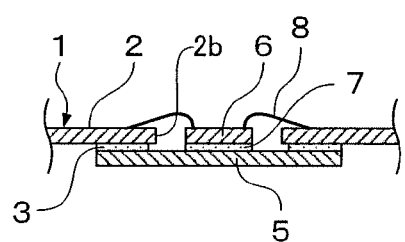
FIG. 6 is a process sectional view for explaining the manufacturing process of the semiconductor device according to the first embodiment of the present invention.
Figure 7:
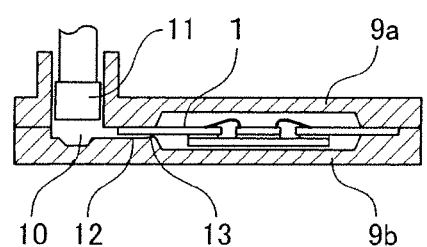
FIG. 7 is a process sectional view for explaining the manufacturing process of the semiconductor device according to the first embodiment of the present invention.
Figure 8:
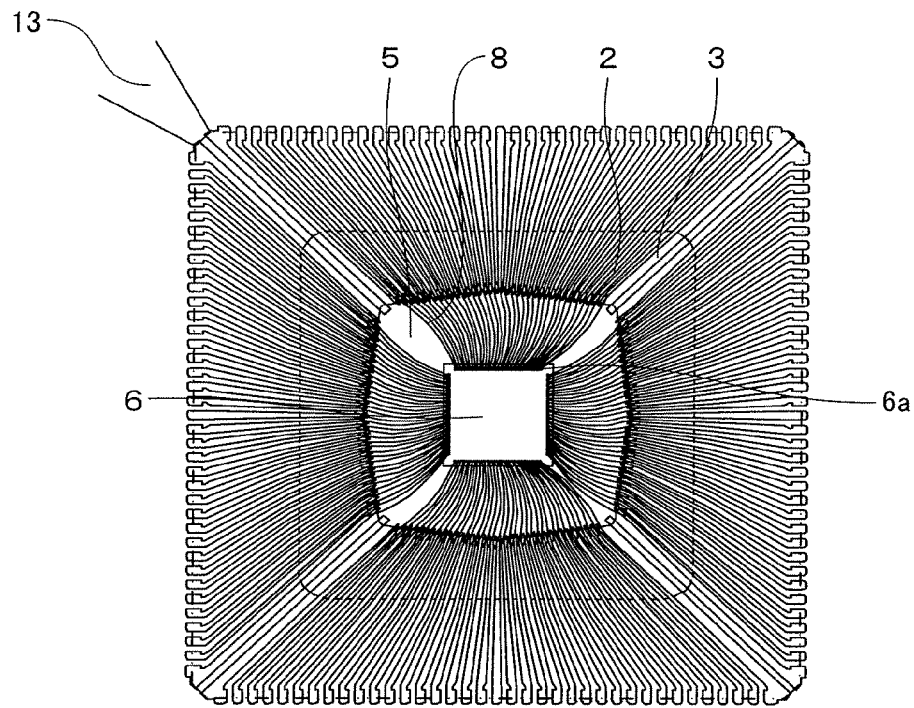
FIG. 8 is an internal plan view showing the internal configuration of the resin-molded semiconductor device according to the first embodiment of the present invention.
Figure 9:
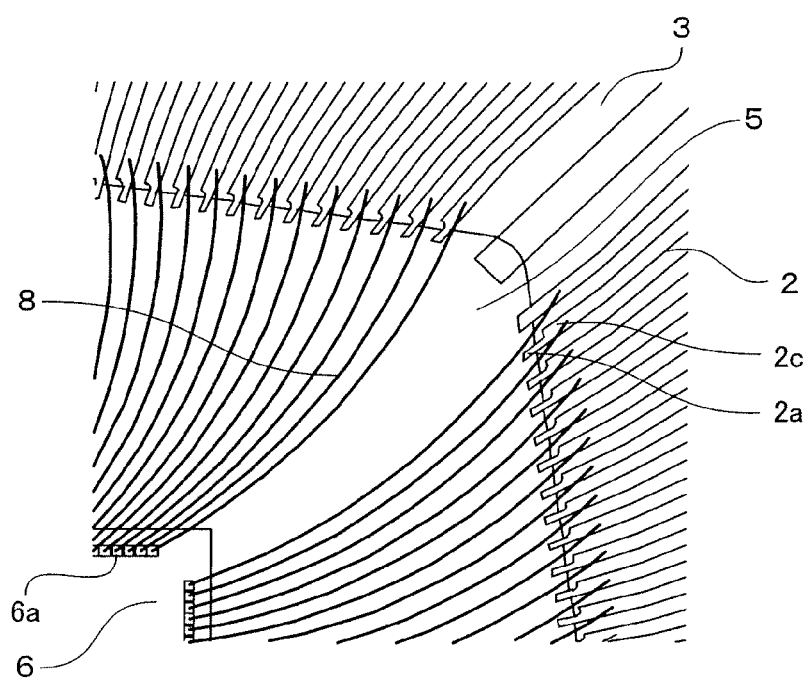
FIG. 9 is an enlarged view showing the main part of FIG. 8.

FIGS. 1 to 4 are main part plan views and process sectional views for explaining the manufacturing process of a semiconductor device according to a first embodiment of the present invention. FIGS. 5 to 7 are process sectional views for explaining the manufacturing process of the semiconductor device according to the first embodiment of the present invention. FIG. 8 is an internal plan view showing the internal configuration of the resin-molded semiconductor device according to the first embodiment of the present invention. FIG. 9 is an enlarged view showing the main part of FIG. 8.

Referring to FIGS. 1 to 7, the following will describe the manufacturing process of the semiconductor device according to the first embodiment of the present invention.

Figure 1:
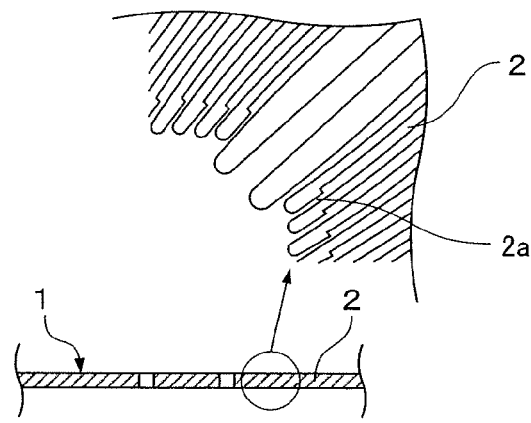
FIG. 1 illustrates a main part plan view and a process sectional view for explaining the manufacturing process of a semiconductor device according to a first embodiment of the present invention.

First, as shown in FIG. 1, a metal plate is worked by etching or stamping to integrally form a frame (not shown) and a plurality of leads 2 which are connected to the frame and protrude to the center of the frame.

At this point, the ends of the adjacent leads 2 are worked to be connected to each other.

Further, at this point, on at least the leads 2 having sides substantially perpendicular to the flowing direction of molding resin during resin molding that will be described later, portions to be the ends of the leads 2 after cutting that will be described later are provided and the portions are closer to the ends of the leads 2 than bonding portions connected to wires during wire bonding that will be described later. On these portions, constricted portions 2a are provided, each having a constricted side upstream of a resin flow. For example, when the outside shape of the semiconductor device is a square, the constricted portions 2a are provided at least on the leads 2 having the sides forming angles of 75° to 105° relative to the injecting direction of molding resin during resin molding. The main part plan views of FIGS. 1 to 4 show the leads 2 having the sides forming angles of 75° to 105° relative to the injecting direction of molding resin.

In the manufacturing process of a QFP package, during resin molding, molding resin is injected to the semiconductor device having been placed in dies before resin molding, from one of the four corners of the package along a diagonal line of the package (resin injecting direction). The injected molding resin expands fanwise, and the wires are substantially circularly deformed along the flow of the molding resin because of the influence of the flow resistance of the resin. The wires connected to the leads having the sides substantially perpendicular to the resin flow are more seriously affected by the flow resistance of the resin. When the outside shape of the semiconductor device is a square, the leads having the sides substantially perpendicular to the resin flow form angles of 75° to 105° relative to the injecting direction of the resin. Thus when the outside shape of the semiconductor device is a square, the constricted portions 2a are provided at least on the leads 2 having the sides forming angles of 75° to 105° relative to the injecting direction of the resin during resin molding.

Further, the bonding portions of the leads 2 have to be at least so wide as to obtain an area for connecting the wires. On the other hand, the constricted portions 2a can have any widths as long as the leads 2 are not deformed until cutting that will be described later. For example, when the leads 2 are 0.1 mm to 0.15 mm in thickness and the ends of the leads 2 (portions to be the ends after cutting) have a pitch of 0.1 mm to 0.25 mm, the bonding portions of the leads 2 have to be at least 0.05 mm to 0.07 mm in width according to the diameters (0.015 mm to 0.03 mm) of the used wires. On the other hand, the widths of the constricted portions 2a may be less than 0.03 mm to 0.05 mm. The constricted portions 2a have to be at least about 0.4 mm to 1.5 mm in length in consideration of cutting that will be described later.

The constricted portions may be provided on all the leads. Even in the case of the leads having the sides substantially perpendicular to the flowing direction of the molding resin, the leads may not include the constricted portions when other leads not connected to the wires are adjacent to the leads on the upstream side of the resin flow. Moreover, before or after the working step of the metal plate, at least the bonding portions of the leads may be plated with Ni, Ag, Au, Pd, and so on to improve wire bonding.

In the working step of the metal plate, a die pad area is formed in the frame to enable the manufacturing of a lead frame according to a second embodiment that will be described later.

Figure 2:
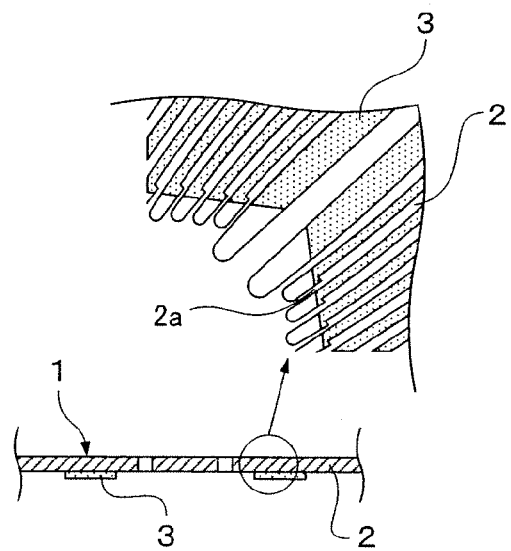
FIG. 2 illustrates a main part plan view and a process sectional view for explaining the manufacturing process of the semiconductor device according to the first embodiment of the present invention.

Next, as shown in FIG. 2, insulating tape 3 having been die-cut into a predetermined frame shape is bonded to the undersides of the ends of the leads 2 (portions to be the ends after cutting). The insulating tape 3 is formed by applying thermosetting adhesive to the top surface and the underside of a heat resistant film made of polyimide resin and so on, or using a film made of thermoplastic resin. The die-cut insulating tape 3 is disposed so as to have the inner frame crossing the constricted portions 2a of the leads 2.

Figure 3:
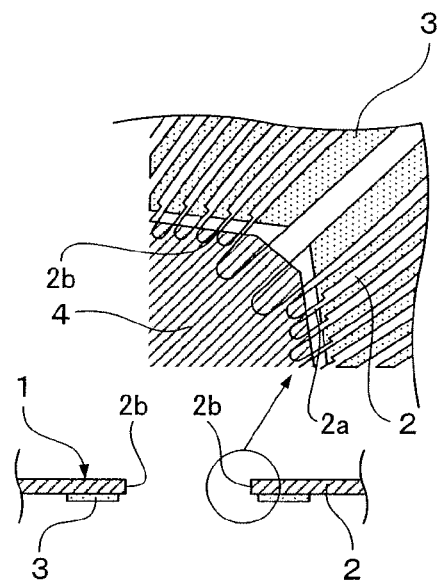
FIG. 3 illustrates a main part plan view and a process sectional view for explaining the manufacturing process of the semiconductor device according to the first embodiment of the present invention.

Next, as shown in FIG. 3, the connected ends of the leads 2 protruding inward out of the inner frame of the insulating tape 3 are cut by stamping using a cutting die 4, so that the leads 2 are separated from one another. At this point, the leads 2 are fixed with the insulating tape 3 and thus the leads 2 are not separately deformed.

In order to sharply cut the ends of the leads 2, it is necessary to avoid cutting portions overlapping the insulating tape 3. Thus considering the installation accuracy of a lead frame 1 to the cutting die 4 and the die-cutting accuracy and bonding accuracy of the insulating tape 3, the inner frame of the insulating tape 3 and cut surfaces 2b on the ends of the leads 2 have to be separated from each other at least by about 0.1 mm to 0.4 mm. Consequently, the leads 2 protrude inward out of the inner frame of the insulating tape 3.

Figure 4:
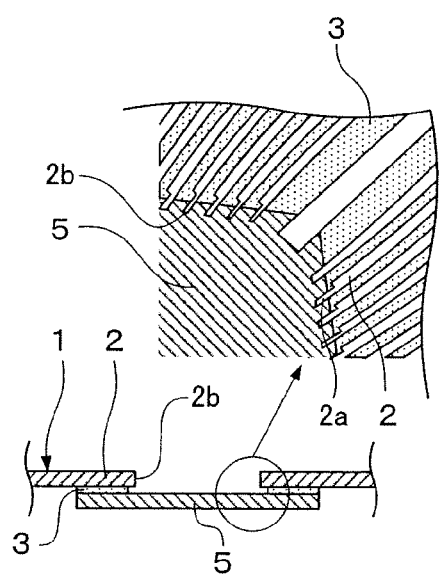
FIG. 4 illustrates a main part plan view and a process sectional view for explaining the manufacturing process of the semiconductor device according to the first embodiment of the present invention.

Next, as shown in FIG. 4, a radiator plate (support plate) 5 having been die-cut into a predetermined shape is bonded to the underside of the insulating tape 3 and is disposed in the frame.

After the steps of FIGS. 1 to 4, the lead frame 1 is completed.

After that, as shown in FIG. 5, a semiconductor chip 6 having a plurality of electrodes (not shown) formed thereon is fixed on the top surface of the radiator plate 5 with an adhesive 7. Thus the plurality of leads 2 protruding to the semiconductor chip 6 are disposed around the semiconductor chip 6 mounted on the top surface of the radiator plate 5.

Next, as shown in FIG. 6, the plurality of electrodes (not shown) formed on a surface of the semiconductor chip 6 are connected to the plurality of leads 2 via a plurality of wires 8. The bonding portions of the leads 2 are set immediately above the insulating tape 3 to reliably apply heat, an ultrasonic wave, and a load, which are wire bonding conditions, to bonding points.

After that, as shown in FIG. 7, the lead frame 1 is sandwiched by molding dies 9a and 9b, molding resin in a pot 10 is melted, the molten molding resin is injected into the dies with a plunger 11 through a runner 12 and a gate 13, and then the molding resin having been injected into the dies is cured to form a molding resin member. The semiconductor chip 6, the radiator plate 5, the wires 8, and the joints of the leads 2 and the wires 8 are molded with the molding resin member (resin molding).

The leads protruding from the molding resin member are then partially cut and bent (not shown) to complete the QFP semiconductor device.

Referring to FIG. 8, the following will describe the semiconductor device according to the first embodiment of the present invention. In the manufacturing process of the QFP package, when the molding resin is injected into the dies from the gate 13 in the resin molding process illustrated in FIG. 6, as shown in FIG. 8, the molding resin is injected to the semiconductor device placed in the dies before resin molding, from one of the four corners of the package along a diagonal line of the package (resin injecting direction). The injected molding resin expands fanwise, and the wires 8 are substantially circularly deformed along the flow of the molding resin as shown in FIG. 8 because of the influence of the flow resistance of the resin. FIG. 9 shows the leads 2 having the sides forming angles of 75° to 105° relative to the resin injection direction. These leads 2 are more seriously affected by the flow resistance of the resin. As shown in FIG. 9, the wires 8 deformed by the flow resistance of the resin come close to the ends of the leads 2 on the downstream side of the resin flow.

In the first embodiment, the leads to which the deformed wires come close have the constricted portions 2a formed closer to the ends of the leads than bonding portions 2c connected to the wires, and the upstream sides of the leads relative to the resin flow, that is, the sides to which the wires come close are constricted so as to be separated from the wires, resulting in no short circuits.

As has been discussed, according to the first embodiment, it is possible to achieve a reliable semiconductor device which can suppress a short circuit of a wire to an adjacent lead, the short circuit being caused by wire sweep during the injection of molding resin. Further, the occurrence of a short circuit caused by wire sweep can be structurally suppressed. Thus it is possible to relax conditions in a resin molding step, increase the number of rows in a lead frame, and reduce a resin injection time and a curing time with molding resin having a short curing time. Thus the first embodiment makes it possible to improve the productivity of the semiconductor device and stably produce the semiconductor device.

Second Embodiment

Figure 10:
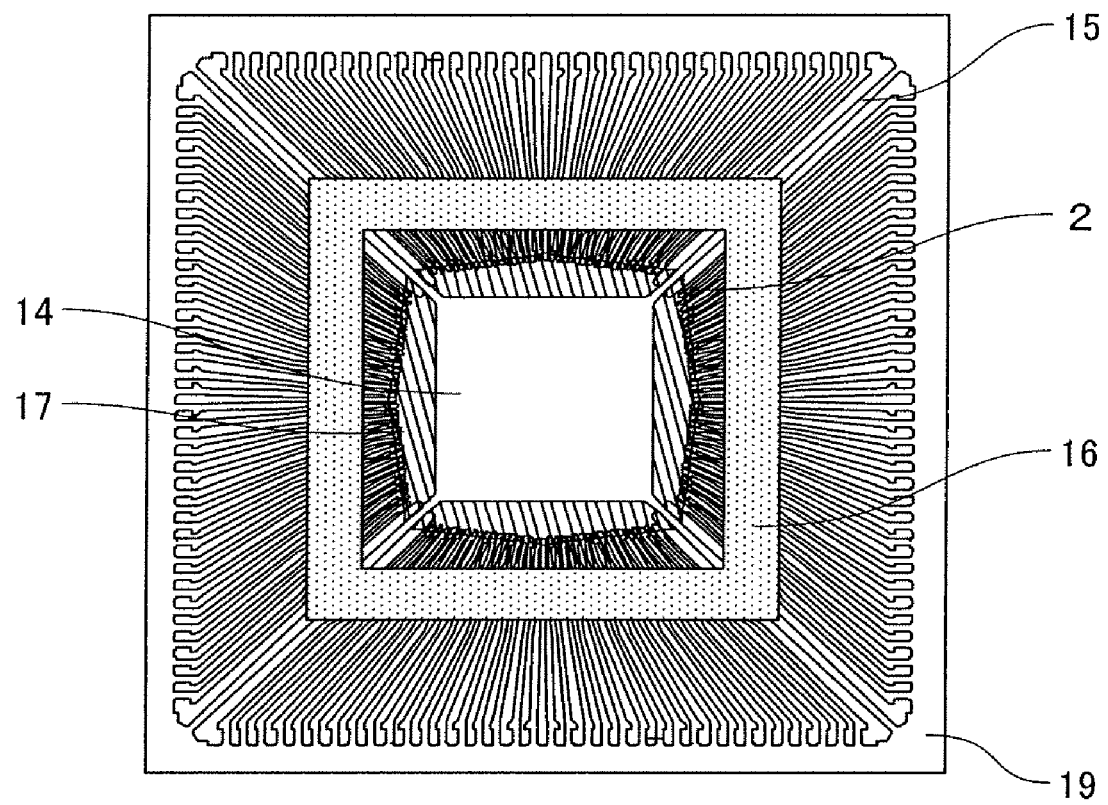
FIG. 10 is a plan view showing a step of cutting the ends of leads and forming a die pad in the manufacturing process of a lead frame according to a second embodiment of the present invention.
Figure 11:
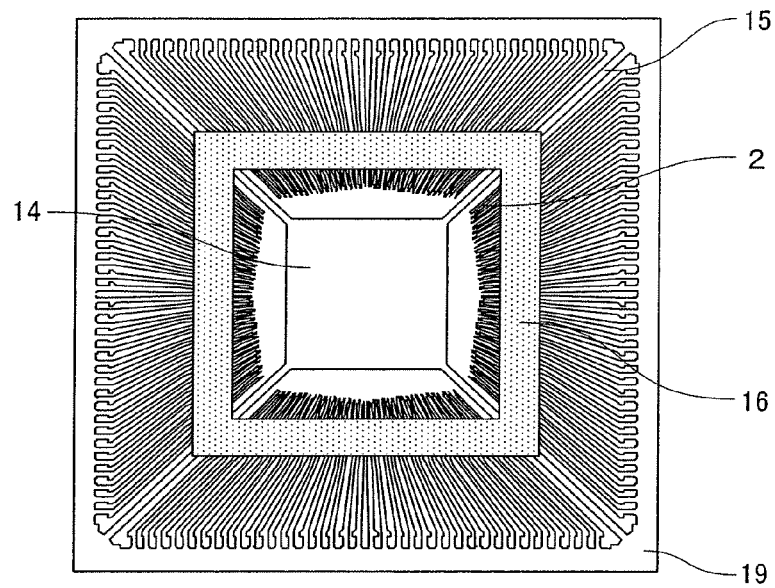
FIG. 11 is a plan view showing the lead frame according to the second embodiment of the present invention.
Figure 12:
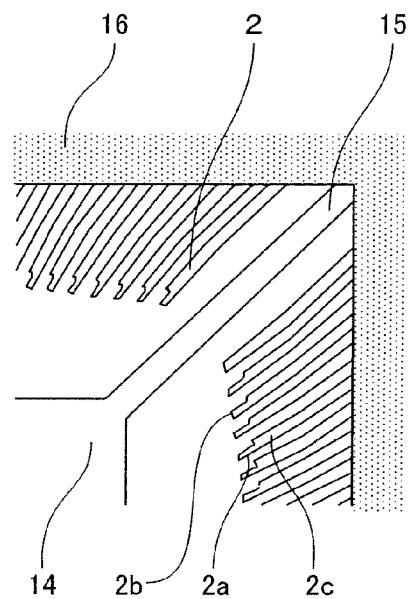
FIG. 12 is an enlarged view showing the main part of FIG. 11.
Figure 13:
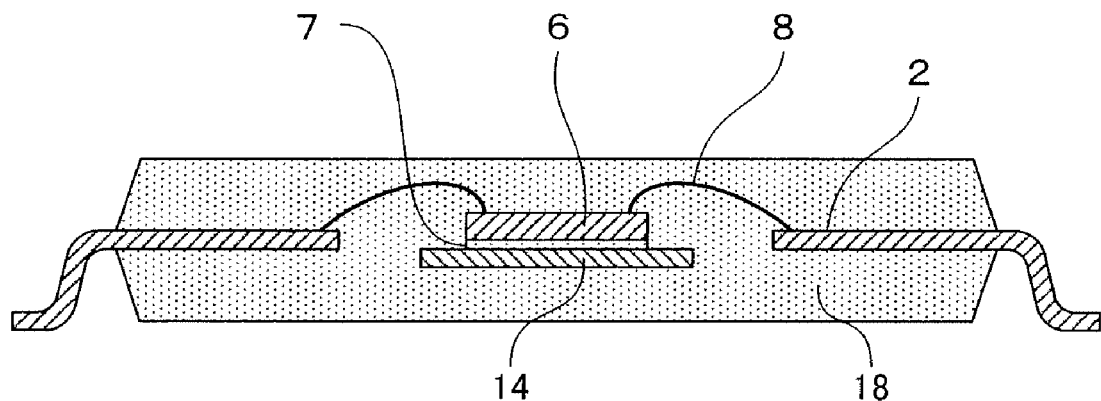
FIG. 13 is a sectional view showing a QFP semiconductor device of the prior art.
Figure 14:
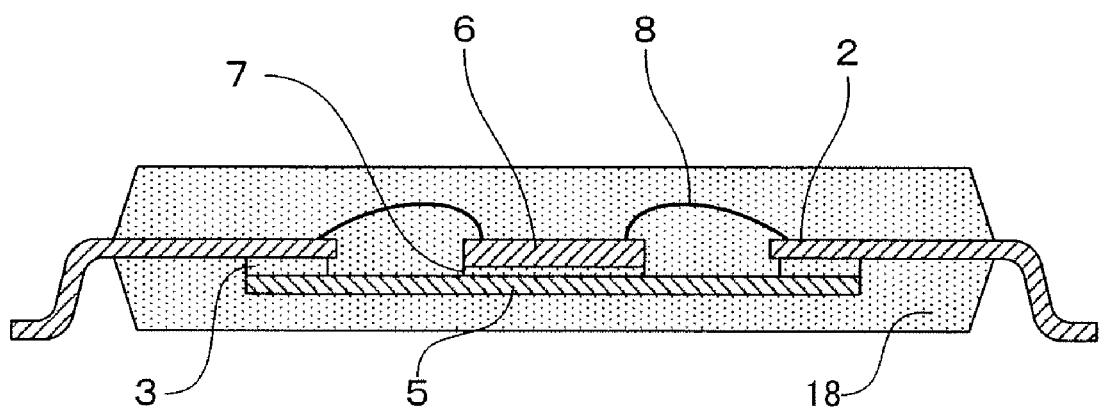
FIG. 14 is a sectional view showing a QFP semiconductor device including a radiator plate of the prior art.
Figure 15:
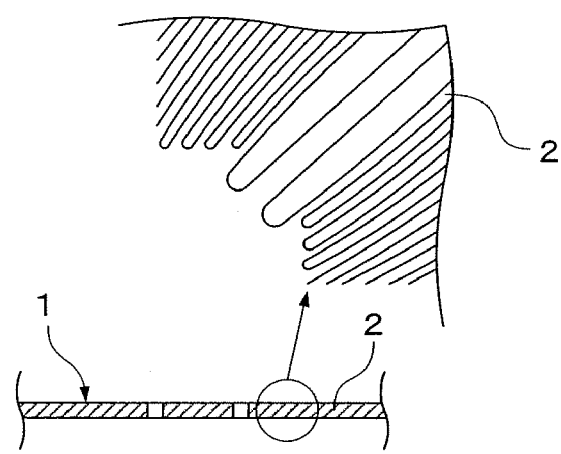
FIG. 15 illustrates a main part plan view and a process sectional view for explaining the manufacturing process of the QFP semiconductor device including the radiator plate of the prior art.
Figure 16:
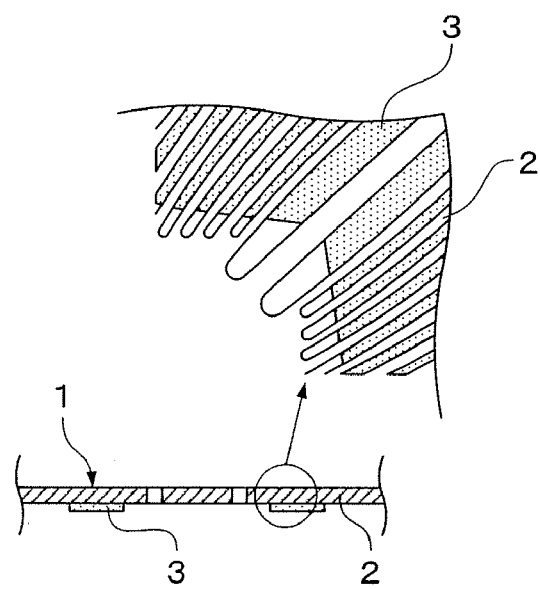
FIG. 16 illustrates a main part plan view and a process sectional view for explaining the manufacturing process of the QFP semiconductor device including the radiator plate of the prior art.
Figure 17:
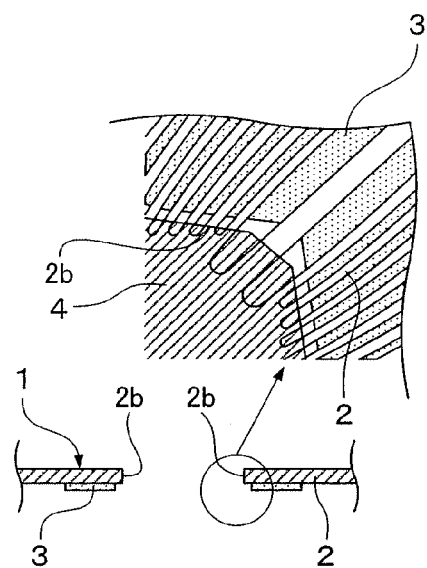
FIG. 17 illustrates a main part plan view and a process sectional view for explaining the manufacturing process of the QFP semiconductor device including the radiator plate of the prior art.
Figure 18:
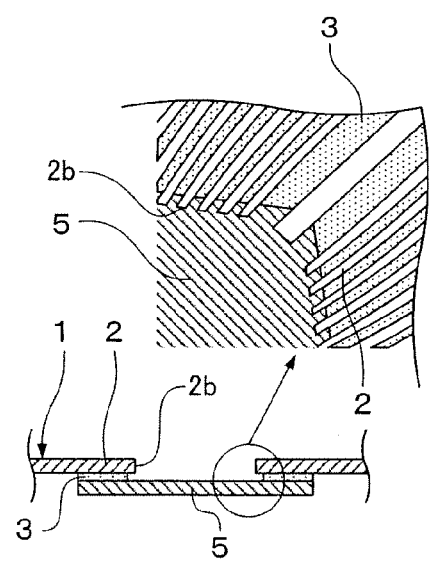
FIG. 18 illustrates a main part plan view and a process sectional view for explaining the manufacturing process of the QFP semiconductor device including the radiator plate of the prior art.
Figure 19:
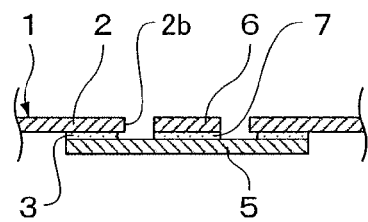
FIG. 19 is a process sectional view for explaining the manufacturing process of the QFP semiconductor device including the radiator plate of the prior art.
Figure 20:
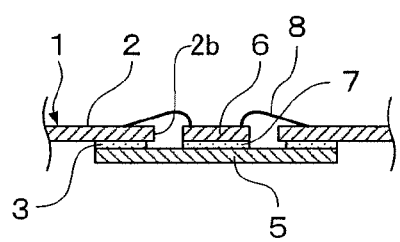
FIG. 20 is a process sectional view for explaining the manufacturing process of the QFP semiconductor device including the radiator plate of the prior art.
Figure 21:
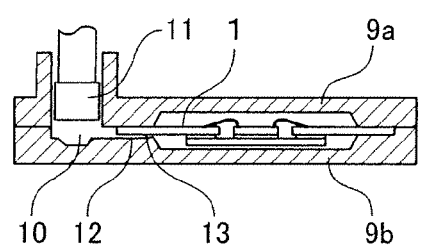
FIG. 21 is a process sectional view for explaining the manufacturing process of the QFP semiconductor device including the radiator plate of the prior art.
Figure 22:
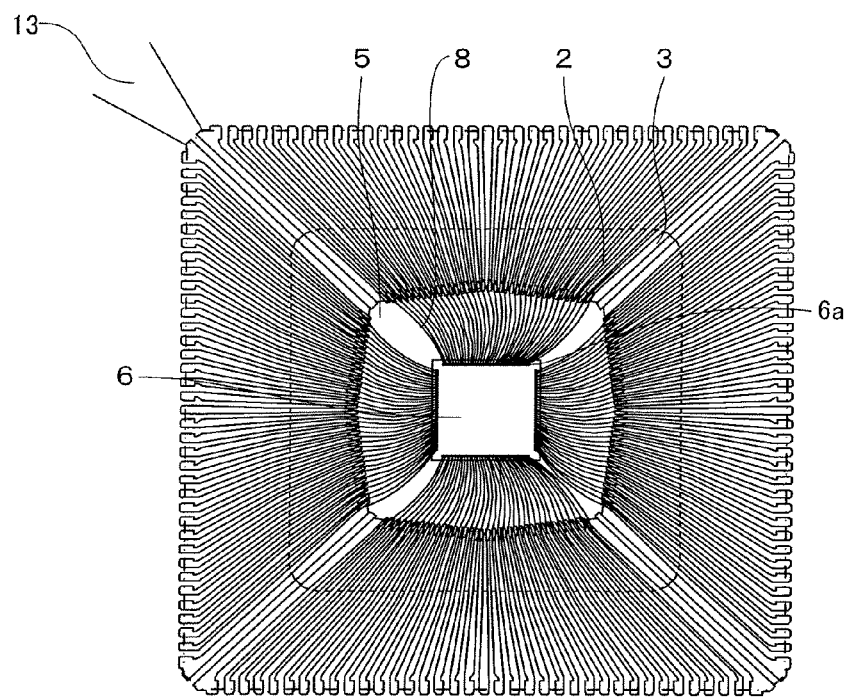
FIG. 22 is an internal plan view showing the internal configuration of the resin-molded QFP semiconductor device including the radiator plate of the prior art.
Figure 23:
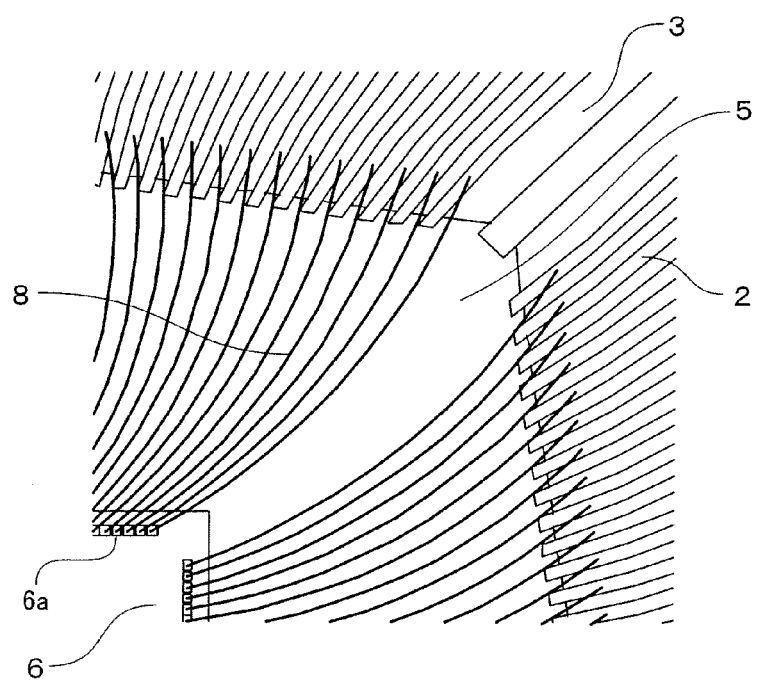
FIG. 23 is an enlarged view showing the main part of FIG. 22.

FIG. 10 is a plan view showing a step of cutting the ends of leads and forming a die pad in the manufacturing process of a lead frame according to a second embodiment of the present invention. FIG. 11 is a plan view showing the lead frame according to the second embodiment of the present invention. FIG. 12 is an enlarged view showing the main part of FIG. 11. Members corresponding to the members illustrated in the first embodiment are indicated by the same reference numerals and the explanation thereof is omitted.

The second embodiment is different from the first embodiment in that the lead frame includes a die pad 14 serving as a support plate disposed in a frame 19.

In the manufacturing process of the lead frame according to the second embodiment, a metal plate is first worked to integrally form the frame 19, a plurality of leads 2 which are connected to the frame 19 and protrude to the center of the frame 19, and die pad supports 15 connected to the frame 19. At this point, the ends of the adjacent leads 2 are connected to each other and the ends of the adjacent die pad support 15 and lead 2 are connected to each other.

Next, as shown in FIG. 10, the ends of the leads 2 are cut by stamping using a cutting die 17, so that the leads 2 are separated from one another and the die pad 14 supported by the die pad supports 15 is formed.

The foregoing explanation described the case where the ends of the leads 2 are cut and the die pad 14 is formed at the same time. The process is not particularly limited. For example, the die pad 14 may be formed when the frame 19, the leads 2, the die pad supports 15 are integrally formed by working a metal plate.

Moreover, as shown in FIG. 10, in order to prevent the leads 2 from being separately deformed after the ends of the leads 2 are cut, lead fixing insulating tape 16 may be bonded outside the bonding portions of the leads 2. The lead fixing insulating tape 16 is formed by, for example, applying thermosetting adhesive to the underside of a heat resistant film made of polyimide resin and so on.

After the foregoing steps, the lead frame of FIG. 11 can be completed. After that, by performing the same steps as FIGS. 5 to 7, a QFP semiconductor device can be completed.

According to the second embodiment, as in the first embodiment, it is possible to achieve a reliable semiconductor device which can prevent a short circuit caused by wire sweep. Further, as in the first embodiment, the second embodiment makes it possible to increase the number of rows in a lead frame and reduce a resin injection time and a curing time. Thus the second embodiment makes it possible to improve the productivity of the semiconductor device and stably produce the semiconductor device.

As has been discussed, in the step of working the metal plate in FIG. 1, by forming a die pad area in the frame to enable the manufacturing of the lead frame of the second embodiment, one of an etching plate and a stamping die can be shared and the lead frame can be formed according to desired heat dissipation capability.

What is claimed is:

1. A lead frame, comprising:
a frame;
a support plate in the frame; and
a plurality of leads connected to the frame, the plurality of leads protruding toward a center of the frame,
wherein a lead has an end extending toward the center of the frame, having a bonding portion connected to a wire and a constricted portion closer to the center of the frame than the bonding portion, and is flat between the constricted portion and the bonding portion, and
a longitudinal side of the lead is constricted at the constricted portion.

2. The lead frame according to claim 1, wherein the constricted side of the lead forms an angle of 75° to 105° relative to an injection direction of resin.

3. The lead frame according to claim 1, wherein the support plate is a radiator plate, and
the lead frame further comprises frame insulating tape between a top surface of the radiator plate and undersides of ends of the leads.

4. The lead frame according to claim 3, wherein the leads protrude inward out of an inner frame of the insulating tape.

5. The lead frame according to claim 1, wherein the end of the lead having the constricted side has a width smaller than a thickness of the end of the lead.

6. The lead frame according to claim 1, wherein another lead is adjacent to the constricted side of the lead.

7. A semiconductor device, comprising:
a semiconductor chip having a plurality of electrodes;
a support plate on which the semiconductor chip is mounted;
a plurality of leads around the semiconductor chip, the plurality of leads protruding toward the semiconductor chip;
a plurality of wires for connecting the electrodes of the semiconductor chip and the leads; and
a molding resin member for integrally molding the semiconductor chip, the support plate, the wires, and joints of the leads and the wires,
wherein a lead has an end extending toward the semiconductor chip, a bonding portion connected to the wire and a constricted portion closer to the semiconductor chip than the bonding portion, and is flat between the constricted portion and the bonding portion,
a longitudinal side of the lead is constricted at the constricted portion.

8. The semiconductor device according to claim 7, wherein the constricted side of the lead forms an angle of 75° to 105° relative to an injection direction of resin.

9. The semiconductor device according to claim 7, wherein the support plate is a radiator plate, and
the semiconductor device further comprises frame insulating tape between a top surface of the radiator plate and undersides of ends of the leads.

10. The semiconductor device according to claim 9, wherein the leads protrude inward out of an inner frame of the insulating tape.

11. The semiconductor device according to claim 7, wherein the end of the lead having the constricted side has a width smaller than a thickness of the end of the lead.

12. The semiconductor device according to claim 7, wherein another lead is adjacent to the constricted side of the lead.

13. A semiconductor device, comprising:
a semiconductor chip having a plurality of electrodes;
a support plate on which the semiconductor chip is mounted;
a plurality of leads around the semiconductor chip, the plurality of leads protruding toward the semiconductor chip;
a plurality of wires for connecting the electrodes of the semiconductor chip and the leads; and
a molding resin member for integrally molding the semiconductor chip, the support plate, the wires, and joints of the leads and the wires,
wherein the lead has an end laterally constricted at a side along a longitudinal direction of the lead, having a narrowing width, and is flat between a laterally constricted portion and a bonding portion connected to the wire.

14. The semiconductor device according to claim 13, wherein the wire connected to the lead having the laterally constricted end is connected to the lead over the laterally constricted portion.

15. A semiconductor device, comprising:
a semiconductor chip having a plurality of electrodes;
a support plate on which the semiconductor chip is mounted;
a plurality of leads around the semiconductor chip, the plurality of leads protruding toward the semiconductor chip;
a plurality of wires for connecting the electrodes of the semiconductor chip and the leads; and
a molding resin member for integrally molding the semiconductor chip, the support plate, the wires, and joints of the leads and the wires,
wherein the lead has an end extending toward the semiconductor chip, having a bonding portion connected to the wire and a constricted portion closer to the semiconductor chip than the bonding portion, and being flat between the constricted portion and the bonding portion, and
a longitudinal side of the lead is constricted at the constricted portion.

16. The semiconductor device according to claim 15, wherein the constricted side of the lead forms an angle of 75° to 105° relative to an injection direction of resin.

17. The semiconductor device according to claim 15, wherein the support plate is a radiator plate, and
the semiconductor device further comprises frame insulating tape between a top surface of the radiator plate and undersides of ends of the leads.

18. The semiconductor device according to claim 17, wherein the leads protrude inward out of an inner frame of the insulating tape.

19. The semiconductor device according to claim 15, wherein the end of the lead having the constricted side has a width smaller than a thickness of the end of the lead.

20. The semiconductor device according to claim 15, wherein another lead is adjacent to the constricted side of the lead.

* * * * *